US 12,145,515 B2

(12) United States Patent
Kuzuhara et al.

(10) Patent No.: US 12,145,515 B2
(45) Date of Patent: Nov. 19, 2024

(54) HEAT DISSIPATION STRUCTURE FOR WIRE HARNESS

(71) Applicants: AUTONETWORKS TECHNOLOGIES, LTD., Yokkaichi (JP); SUMITOMO WIRING SYSTEMS, LTD., Yokkaichi (JP); SUMITOMO ELECTRIC INDUSTRIES, LTD., Osaka (JP); SUMITOMO RIKO COMPANY LIMITED, Komaki (JP)

(72) Inventors: Fumihiro Kuzuhara, Yokkaichi (JP); Takahiro Nishiyama, Komaki (JP); Kei Yoshikawa, Komaki (JP)

(73) Assignees: AutoNetworks Technologies, Ltd., Yokkaichi (JP); Sumitomo Wiring Systems, Ltd., Yokkaichi (JP); Sumitomo Electric Industries, Ltd., Osaka (JP); Sumitomo Riko Company Limited, Komaki (JP)

( * ) Notice: Subject to any disclaimer, the term of this patent is extended or adjusted under 35 U.S.C. 154(b) by 395 days.

(21) Appl. No.: 17/597,825

(22) PCT Filed: Jul. 22, 2020

(86) PCT No.: PCT/JP2020/028401
§ 371 (c)(1),
(2) Date: Jan. 25, 2022

(87) PCT Pub. No.: WO2021/020266
PCT Pub. Date: Feb. 4, 2021

(65) Prior Publication Data
US 2022/0314907 A1 Oct. 6, 2022

(30) Foreign Application Priority Data
Jul. 29, 2019 (JP) .................................. 2019-139091

(51) Int. Cl.
*H01B 7/42* (2006.01)
*B60R 16/02* (2006.01)

(52) U.S. Cl.
CPC ......... *B60R 16/0215* (2013.01); *H01B 7/423* (2013.01)

(58) Field of Classification Search
CPC . H01B 7/17; H01B 7/42; H01B 7/423; H01B 9/02; H01B 9/04; H01B 13/22;
(Continued)

(56) References Cited

U.S. PATENT DOCUMENTS 9,358,938 B2 * 6/2016 Inao .......................... H02G 3/32
9,522,639 B2 * 12/2016 Inao ..................... H02G 3/0481
(Continued)

FOREIGN PATENT DOCUMENTS

CN 106448900 A 2/2017
JP 2007-149550 A 6/2007
(Continued)

OTHER PUBLICATIONS

International Search Report issued in International Patent Application No. PCT/JP2020/028401, mailed Oct. 13, 2020. ISA/Japan Patent Office.
(Continued)

*Primary Examiner* — William H. Mayo, III
(74) *Attorney, Agent, or Firm* — Honigman LLP (57) ABSTRACT

A heat dissipation structure for a wire harness is configured to provide heat dissipation while achieving versatility using a simple structure. The heat dissipation structure for a wire harness includes wire harnesses, heat dissipation bodies with which the wire harnesses are in contact in a heat conductive manner, and a heat conductive member whose heat conductivity is improved in a specific direction. The wire harnesses and the heat dissipation bodies are pressed against each
(Continued)

other with the heat conductive member sandwiched in between in the specific direction.

5 Claims, 6 Drawing Sheets

(58) Field of Classification Search
CPC .......... H02G 3/04; H02G 3/06; H02G 3/0625; H02G 3/0412; H02G 3/0462; H02G 3/0468; H02G 3/0481; H02G 3/0487
USPC .................................. 174/74 R–94 R, 102 R
See application file for complete search history.

(56) References Cited

U.S. PATENT DOCUMENTS

| | | | | |
|---|---|---|---|---|
| 11,447,081 | B2* | 9/2022 | Tamaru | ..................... H01B 7/04 |
| 2009/0294149 | A1* | 12/2009 | Watanabe | .............. H01B 7/426 |
| | | | | 174/102 R |
| 2010/0126752 | A1* | 5/2010 | Watanabe | .............. H01B 7/426 |
| | | | | 174/102 D |
| 2011/0132638 | A1* | 6/2011 | Oga | ..................... B60R 16/0215 |
| | | | | 174/135 |
| 2012/0305308 | A1* | 12/2012 | Toyama | ............... H02G 3/0481 |
| | | | | 174/70 R |
| 2013/0008710 | A1* | 1/2013 | Toyama | .............. B60R 16/0215 |
| | | | | 174/70 C |
| 2014/0284102 | A1* | 9/2014 | Ichikawa | ............. H02G 3/0625 |
| | | | | 174/72 A |
| 2015/0243411 | A1* | 8/2015 | Maeda | .................... H01B 7/423 |
| | | | | 174/47 |
| 2020/0075215 | A1* | 3/2020 | Nanbara | ................. H01F 27/02 |

FOREIGN PATENT DOCUMENTS

| | | |
|---|---|---|
| JP | 2009-51148 A | 3/2009 |
| JP | 2013-135540 A | 7/2013 |
| JP | 2015-105282 A | 6/2015 |
| JP | 2017-91800 A | 5/2017 |
| JP | 2018-148007 A | 9/2018 |
| WO | 2008/062885 A1 | 3/2010 |

OTHER PUBLICATIONS

Japanese Office Action dated Oct. 4, 2022, Application No. 2019-139091.
International Preliminary Report on Patentability and Written Opinion, relating to application No. PCT/JP2020/028401, dated Feb. 1, 2022.
Chinese Office Action, Patent Application No. 202080052576.6, dated May 31, 2023.

* cited by examiner

HEAT DISSIPATION STRUCTURE FOR WIRE HARNESS

CROSS-REFERENCE TO RELATED APPLICATIONS

This application is the U.S. national stage of PCT/JP2020/028401 filed on Jul. 22, 2020, which claims priority of Japanese Patent Application No. JP 2019-139091 filed on Jul. 29, 2019, the contents of which are incorporated herein.

TECHNICAL FIELD

The present disclosure relates to a heat dissipation structure for a wire harness.

BACKGROUND ART

Conventionally, high-voltage wire harnesses for connecting between a battery and an inverter have been routed in vehicles such as hybrid automobiles and electric automobiles. Since a high-voltage wire harness generates a large amount of heat when energized, it is required to improve the heat dissipation of the wire harness. Therefore, for example, Japanese National Re-publication of International Patent Application No. JPWO 2008/062885 A1 proposes a structure in which a metal pipe housing a wire harness is provided with a groove-shaped fitting portion that is in close contact with the outer periphery of the wire harness, and the groove-shaped fitting portion is brought into close contact with the outer periphery of the wire harness housed in the pipe. According to this structure, since the groove-shaped fitting portion of the metal pipe is in close contact with the outer periphery of the wire harness, the heat generated in the wire harness is directly conducted to the metal pipe, and is efficiently dissipated from the outer periphery of the metal pipe into the atmosphere.

However, in the structure of Japanese National Re-publication of International Patent Application No. JPWO 2008/062885 A1, it is necessary to process a metal pipe into a specific shape. Thus, a structure capable of improving the heat dissipation of the wire harness while simplifying the manufacturing process and improving versatility has been required.

Therefore, it is an object to provide a heat dissipation structure for a wire harness with a novel structure which is able to surely obtain excellent heat dissipation while improving versatility with a simple structure.

SUMMARY

The present disclosure provides a heat dissipation structure for a wire harness comprising: at least one wire harness; a heat dissipation body with which the wire harness is in contact in a heat conductive manner; and at least one heat conductive member whose heat conductivity is improved in a specific direction, wherein the wire harness and the heat dissipation body are pressed against each other with the heat conductive member sandwiched in between in the specific direction.

Effect of the Disclosure

According to the present disclosure, it is possible to provide a heat dissipation structure for a wire harness which is able to surely obtain excellent heat dissipation while improving versatility with a simple structure.

DETAILED DESCRIPTION OF PREFERRED EMBODIMENTS

First, preferred embodiments of the present disclosure will be listed and described.

A first aspect of present disclosure provides a heat dissipation structure for a wire harness comprising: at least one wire harness; a heat dissipation body with which the wire harness is in contact in a heat conductive manner; and at least one heat conductive member whose heat conductivity is improved in a specific direction, wherein the wire harness and the heat dissipation body are pressed against each other with the heat conductive member sandwiched in between in the specific direction.

According to the heat dissipation structure for a wire harness of the present disclosure, a heat conductive member is interposed between the wire harness and the heat dissipation body, and the wire harness and the heat dissipation body are pressed against each other in a specific direction of the heat conductive member in which heat conductivity is improved. Therefore, heat conduction from the wire harness to the heat dissipation body via the heat conductive member is advantageously promoted.

Moreover, it is sufficient to interpose the heat conductive member between the wire harness and the heat dissipation body so as to be sandwiched in a specific direction. This makes it possible to simply implement the heat dissipation structure of the present disclosure without the need to change the shapes of the existing wire harness and heat dissipation body or the like. Therefore, it is possible to provide a heat dissipation structure for a wire harness which is able to surely obtain excellent heat dissipation while improving versatility with a simple structure. In particular, since the wire harness and the heat dissipation body are pressed against each other with the heat conductive member sandwiched in the specific direction, efficient heat conduction can be stably maintained.

Anything can be adopted as the heat conductive member as long as a heat conductivity is improved in a specific direction. For example, it is possible to adopt a heat conductive body in which a heat conductive filler is contained in a base material made of an elastomer or the like, and the heat conductivity is improved in a specific direction by the heat conductive filler being oriented.

In a second aspect, it is preferable that the heat conductive member includes a heat conductive sheet having flexibility, and the specific direction is a thickness direction of the heat conductive sheet. By adopting the heat conductive sheet having flexibility as the heat conductive member, it is possible to dispose the heat conductive sheet along the surface of wire harnesses and heat dissipation bodies having various shapes. By simply pressing the wire harness and the heat dissipation body against each other in this state, it is possible to surely realize the configuration in which the heat conductive sheet is sandwiched between the wire harness and the heat dissipation body in the thickness direction of the heat conductive sheet in which the heat conductivity is improved. Therefore, the heat dissipation structure for a wire harness, which is more versatile, can be easily provided while reliably obtaining the excellent heat dissipation.

Further, by adopting the sheet-shaped heat conductive sheet as the heat conductive member, it is possible to advantageously avoid a situation in which the heat conductive member is unnecessarily arranged between the wire harness and the heat dissipation body in a direction other than the direction in which the heat conductivity is improved, which may cause trapped heat on the contrary.

In a third aspect, is preferable that the heat conductive member includes a base material made of a foam. By adopting the heat conductive member whose base material is a foam, the heat conductive member easily deforms following the outer surface shapes of the wire harness and the heat dissipation body. Thus, it is possible to advantageously increase the contact area of the heat conductive member with the wire harness and the heat dissipation body.

In a fourth aspect is preferable that the heat dissipation body includes a cooling pipe extending along the wire harness and through which a refrigerant is inserted, and a tubular member in which the wire harness is housed in an inserted state. A structure in which a cooling pipe runs parallel to a wire harness for the purpose of cooling the wire harness has been conventionally adopted. However, by interposing the heat conductive member between the wire harness and the cooling pipe in the specific direction so as to press the wire harness and the cooling pipe against each other, the heat generated in the wire harness can be quickly transferred to the cooling pipe to efficiently realize heat dissipation (heat absorption) to the cooling pipe. Besides, by interposing the heat conductive member in the specific direction between the wire harness and the tubular member housing the wire harness in an inserted state and by pressing the wire harness and the cooling pipe against each other, it is possible to quickly transfer the heat generated in the wire harness to the tubular member to efficiently realize heat dissipation to the atmosphere via the tubular member.

Further, in combination with the above-mentioned structure (2), using a single heat conductive sheet, it is also possible to press the wire harness and the cooling pipe against each other, as well as the wire harness and the tubular member against each other with the heat conductive sheet sandwiched in between in the thickness direction. With this configuration, the heat transfer path of the wire harness to the two heat dissipation bodies can be efficiently constructed with a small number of parts.

In a fifth aspect is preferable that with the above-mentioned structure (1) or (3), the heat conductive member includes a heat conductive sheet having flexibility, and the specific direction is a thickness direction of the heat conductive sheet, the heat dissipation body is constituted by a cooling pipe extending along the wire harness and through which a refrigerant is inserted, an intermediate portion in a length direction of the heat conductive sheet constitutes an outer peripheral close-contact portion that is wound around and brought into close contact with an outer peripheral surface of the cooling pipe, opposite end portions in the length direction of the heat conductive sheet are overlapped with each other to constitute a lateral projecting portion projecting to a lateral side of the cooling pipe, the at least one wire harness comprises a first wire harness and a second wire harness, the first wire harness and the second wire harness are pressed against each other at respective first contact parts with the lateral projecting portion sandwiched in between in the thickness direction, and the first wire harness and the second wire harness are in contact with the cooling pipe at respective second contact parts, which are different from the first contact parts, with the outer peripheral close-contact portion sandwiched in between in the thickness direction.

This is because by winding the heat conductive sheet around the outer peripheral surface of the cooling pipe, the outer peripheral close-contact portion and the lateral projecting portion can be easily constituted, and it is possible to advantageously construct a structure in which the two wire harnesses and the cooling pipe, which is the heat dissipation body, are pressed against each other with the heat conductive sheet sandwiched in between in the thickness direction. Moreover, the lateral projecting portion in which the heat conductive sheet is doubly overlapped is interposed between the contact surfaces of the first wire harness and the second wire harness. With this configuration, in each wire harness, heat exchange with the cooling pipe, with which the each wire harness is in contact with the single heat conductive sheet sandwiched in between in the thickness direction, is preferentially promoted, so that the heat dissipation (heat absorption) of the each wire harness by the cooling pipes can be surely promoted.

In a sixth aspect, is preferable that with the above-mentioned first or third aspect, the heat conductive member includes a heat conductive sheet having flexibility, and the specific direction is a thickness direction of the heat conductive sheet, the at least one wire harness comprises a first wire harness and a second wire harness, the heat dissipation body is constituted by a cooling pipe extending along the wire harness and through which a refrigerant is inserted, and a tubular member extending in a rectangular cross-sectional shape and in which the wire harness is housed in an inserted state, the cooling pipe is arranged at a center portion in a width direction of a bottom wall of the tubular member, and the first wire harness and the second wire harness are arranged at parts that are remote from the cooling pipe to opposite sides in the width direction, an intermediate portion in a length direction of the heat conductive sheet constitutes an outer peripheral close-contact portion that is wound around and brought into close contact with an outer peripheral surface of the cooling pipe from an upper side of the cooling pipe, opposite end portions in the length direction of the heat conductive sheet constitute a first side close-contact portion and a second side close-contact portion that are wound around and brought into close contact with respective outer peripheral surfaces of the first wire harness and the second wire harness from a lower side of the first wire harness and the second wire harness, the first wire harness and the second wire harness are in contact with the cooling pipe at respective first contact parts with the outer peripheral close-contact portion sandwiched in between in the thickness direction, and the first wire harness and the second wire harness are in contact with the tubular member at respective second contact parts, which are different from the first contact parts, with the first side close-contact portion and the second side close-contact portion sandwiched in between in the thickness direction.

By arranging such that the intermediate portion in the length direction of the heat conductive sheet is placed from above the cooling pipe that is placed on the bottom wall of the tubular member, and by placing the first and second wire harnesses on the opposite end portions in the length direction of the heat conductive sheet from the upper side, each close contact-portion can be easily constituted. Besides, using a single heat conductive sheet, it is possible to press the wire harness and the cooling pipe against each other, as well as the wire harness and the tubular member against each other with the heat conductive sheet sandwiched in between in the thickness direction. With this configuration, the heat transfer path of the wire harness to the plurality of heat dissipation bodies can be efficiently constructed with a small number of parts. It is acceptable as long as the first wire harness and the second wire harness are in contact with the tubular member at least at the second contact part, but the first wire harness and the second wire harness may be in contact with the tubular member at a plurality of contact parts. For example, it is even more preferable that the first wire harness and the second wire harness are in contact with the bottom wall of the tubular member at the respective second contact parts, which are different from the first contact parts, with the first side close-contact portion and the second side close-contact portion sandwiched in between in the thickness direction, and are in contact with the side wall of the tubular member at the respective third contact parts, which are different from the first and second contact parts, with the first side close-contact portion and the second side close-contact portion sandwiched in between in the thickness direction. With this configuration, it is possible to promote heat dissipation of the first wire harness and the second wire harness while stably holding the first wire harness and the cooling pipe in the tubular member.

In a seventh aspect is preferable that with the above-mentioned first or third aspect, the heat conductive member includes a heat conductive sheet having flexibility, and the specific direction is a thickness direction of the heat conductive sheet, the at least one wire harness comprises a first wire harness and a second wire harness, the heat dissipation body is constituted by cooling pipes extending along the wire harness and through which a refrigerant is inserted, and a tubular member extending in a rectangular cross-sectional shape and in which the wire harness is housed in an inserted state, the cooling pipes comprising a first cooling pipe and a second cooling pipe, the first wire harness and the second wire harness are arranged at two locations that are remote from each other in a width direction of a bottom wall of the tubular member, the heat conductive sheet is wound around the first wire harness and the second wire harness in an annular shape, the heat conductive sheet wound in the annular shape is provided with a pair of recessed portions recessed from upper and lower sides in a gap between the first wire harness and the second wire harness, and the first cooling pipe and the second cooling pipe are arranged in the respective recessed portions, the first cooling pipe and the second cooling pipe are respectively in contact with an upper wall and the bottom wall of the tubular member, the first wire harness and the second wire harness are in contact with the cooling pipes at respective upper first contact parts and at respective lower first contact parts with the heat conductive sheet sandwiched in between in the thickness direction, and the first wire harness and the second wire harness are in contact with the bottom wall, a side wall, and the upper wall of the tubular member at respective second through fourth contact parts provided at different parts in respective circumferential directions with the heat conductive sheet sandwiched in between in the thickness direction.

Inside the tubular member, it is possible to stably hold the wire harness and the cooling pipe in predetermined parts via the heat conductive sheet. Besides, simply by winding the heat conductive sheet in an annular shape around the first wire harness and the second wire harness that are remote from each other, it is possible to press the wire harness and the tubular member against each other, as well as the wire harness and the cooling pipe against each other, at a plurality of locations with the heat conductive sheet sandwiched in between in the thickness direction, while constituting the pair of recessed portions for housing the two cooling pipes. With this configuration, the heat transfer path of the wire harness to the two heat dissipation bodies can be efficiently constructed with a small number of parts.

In an eighth aspect is preferable that the at least one heat conductive member comprises a plurality of heat conductive members, and the heat conductive members are respectively arranged at a plurality of locations that are remote from each other in a length direction of the wire harness.

Since the heat conductive member whose heat conductivity is improved in the specific direction is used, even if the heat conductive member is partially provided without being provided over the entire length of the wire harness, the desired heat conduction from the wire harness to the heat dissipation body can be advantageously realized. This makes it possible to achieve cost reduction, weight reduction, and the like.

Specific examples of the heat dissipation structure for a wire harness of the present disclosure will be described below with reference to the drawings. The present disclosure is not limited to these examples, but is indicated by the scope of the claims, and all changes that come within the meaning and range of equivalency of the claims are intended to be embraced therein.

Embodiment 1

Figure 1:
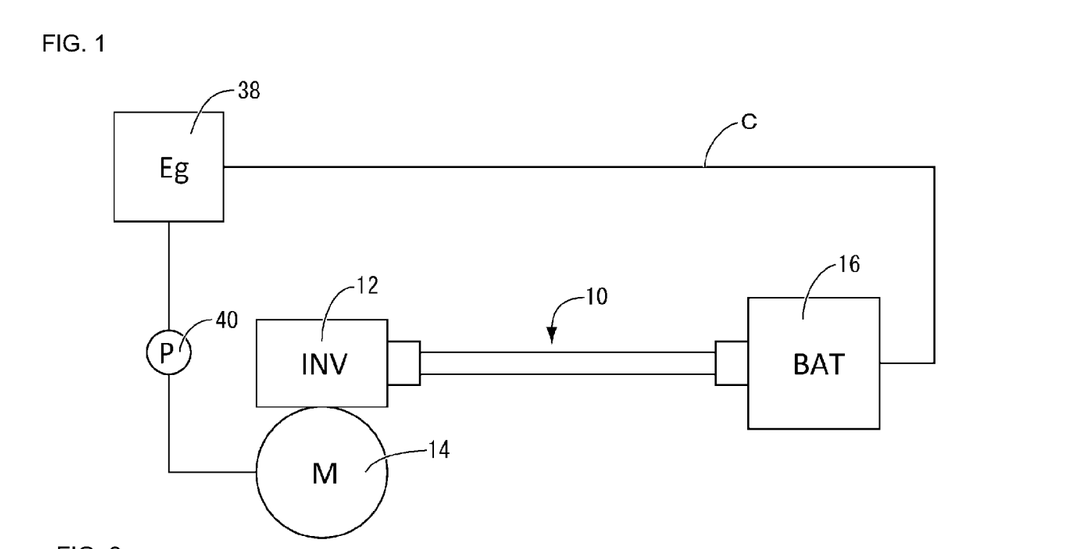
FIG. 1 is a schematic diagram showing a state in which a heat dissipation structure for a wire harness according to Embodiment 1 is mounted on an electric automobile.
Figure 2:
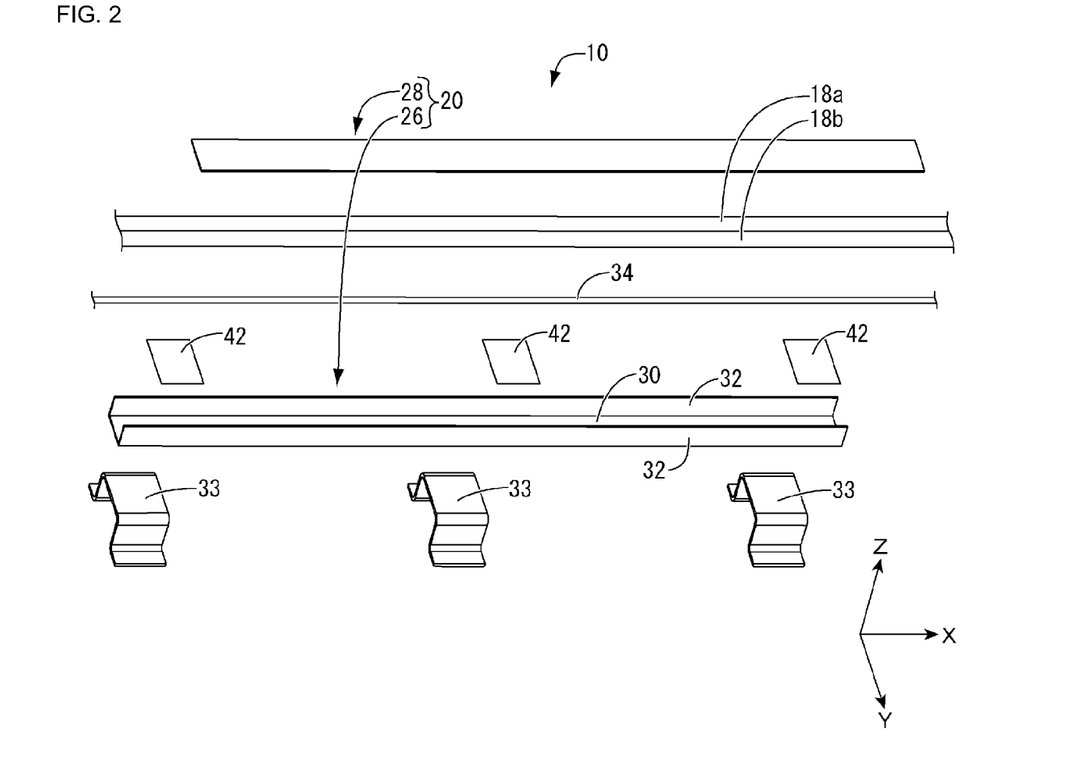
FIG. 2 is an exploded perspective view of the heat dissipation structure for a wire harness shown in FIG. 1.
Figure 3:
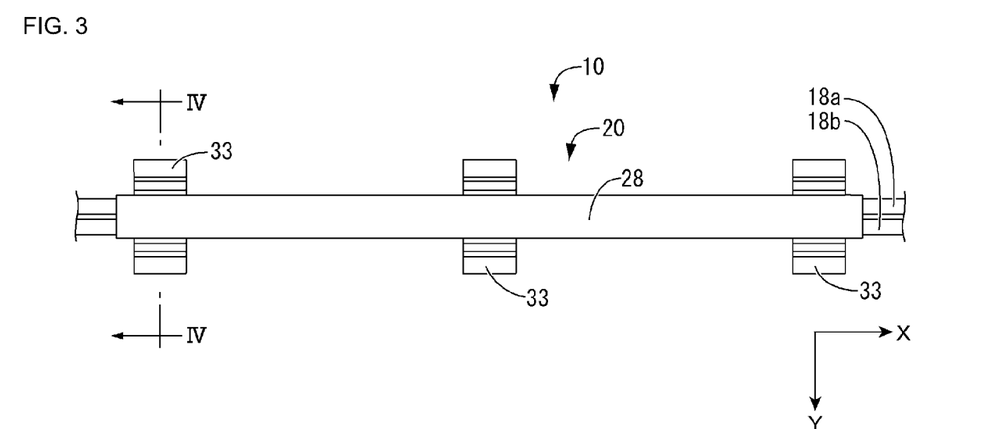
FIG. 3 is a plan view showing an assembled state of the heat dissipation structure for a wire harness shown in FIG. 2.

Hereinafter, Embodiment 1 of the present disclosure will be described with reference to FIGS. 1 to 4. FIG. 1 shows an overall configuration when a heat dissipation structure 10 for a wire harness of Embodiment 1 of the present disclosure is applied to a vehicle such as an electric automobile or a hybrid automobile (not shown). A motor 14 on which an inverter 12 is mounted is arranged in the front of the vehicle (not shown), and a battery 16 is arranged in the rear of the vehicle. As shown in FIG. 2, they are connected by a plurality of (two in the figure) high-voltage wire harnesses, namely a first wire harness 18*a* and a second wire harness 18*b*. The first wire harness 18*a* and the second wire harness 18*b* are housed in a tubular member 20 constituting a heat dissipation body in an inserted state. Here, the inverter 12 is used to convert the electric power supplied from the battery 16 into alternating current in order to drive the motor 14 of the automobile. Besides, the first wire harness 18*a* and the second wire harness 18b constituting the heat dissipation structure 10 for a wire harness can be arranged in any orientation. In the following description, the Z direction shown in FIG. 2 will be described as upward, the Y direction as the width direction, and the X direction as the length direction. The right side in the X direction is the battery 16 side, and the opposite direction is the inverter 12 side. Further, for a plurality of the same members, a reference numeral may be added to only a part of the members, and the reference numeral may be omitted for other members.

First and Second Wire Harnesses 18a, 18b

As shown in FIG. 2, the heat dissipation structure 10 for a wire harness of Embodiment 1 of the present disclosure includes the first wire harness 18a and the second wire harness 18b. The first wire harness 18a connects the positive terminals of the battery 16 and the inverter 12, while the second wire harness 18b connects the negative terminals of the battery 16 and the inverter 12. Both the first wire harness 18a and the second wire harness 18b have a form in which the outer periphery of a conductor 22 made of a metal (for example, an aluminum alloy or a copper alloy) is surrounded by an insulating covering 24 made of a synthetic resin. The conductor 22 comprises a stranded wire in which a plurality of thin wires (not shown) are twisted in a spiral shape. The cross-sectional shape of the first wire harness 18a and the second wire harness 18b is such that both the conductor 22 and the insulating covering 24 are perfectly circular.

Tubular Member 20

As shown in FIG. 2, the tubular member 20 includes a tubular portion main body 26 of gutter shape extending in the length direction and a lid body 28 of rectangular flat plate shape covering the upper opening of the tubular portion main body 26. The tubular portion main body 26 includes a bottom wall 30 of rectangular flat plate shape extending in the length direction and a side wall 32 of rectangular flat plate shape protruding upward from the opposite end portions in the width direction of the bottom wall 30. On the lower surface of the bottom wall 30, at three locations that are remote from each other in the length direction, inverted U-shaped fixing leg portions 33 for fixing to a desired position of a vehicle or the like (not shown) are provided by any means such as welding. The tubular portion main body 26, the lid body 28, and the fixing leg portions 33 constituting the tubular member 20 are formed by pressing a metal plate material into a predetermined shape. As the metal constituting such a metal plate material, a metal having high heat conductivity such as copper, a copper alloy, aluminum, and an aluminum alloy can be appropriately selected.

Cooling Pipe 34

Figure 4:
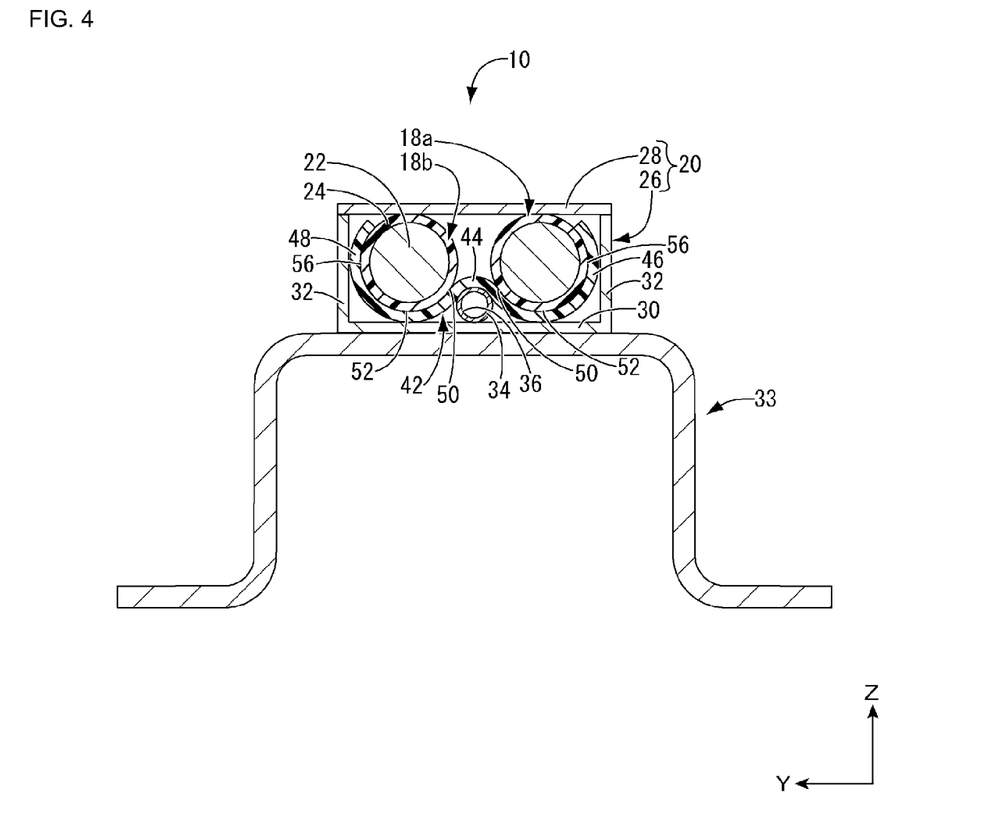
FIG. 4 is an enlarged cross-sectional view taken along line 4-4 of FIG. 3.

As shown in FIG. 2, the heat dissipation structure 10 for a wire harness according to Embodiment 1 of the present disclosure includes one cooling pipe 34 constituting the heat dissipation body. The one cooling pipe 34 extends in parallel along the first wire harness 18a and the second wire harness 18b. The cooling pipe 34 has a round tubular shape, and as shown in FIG. 4, the inside of the cooling pipe 34 comprises a cooling passage 36 through which a refrigerant (not shown) is inserted. The first wire harness 18a and the second wire harness 18b are arranged in parallel with a gap therebetween, and the cooling pipe 34 is arranged between them and extends in the left-right direction of FIG. 2. The cooling pipe 34 is constituted by an elongated pipe having an outer diameter slightly smaller than the outer diameters of the first wire harness 18a and the second wire harness 18b, and is made of a material having heat resistance, pressure resistance, and flexibility.

As shown in FIG. 1, the cooling pipe 34 is incorporated in the cooling water circulation circuit C for cooling an engine 38 mounted on the vehicle. The circulation circuit C itself uses an existing circuit for cooling the engine, and the circuit is constituted by a circuit connecting the cooling pipe 34 being branched from the existing circuit. Further, a circulation pump 40 and a radiator (not shown) are arranged in the circulation circuit C to circulate the cooling water flowing through the cooling pipe 34.

Heat Conductive Sheet 42

As shown in FIG. 2, heat conductive sheets 42 constituting the heat conductive members are wound around and in close contact with the outer peripheral surfaces of the first wire harness 18a, the second wire harness 18b, and the one cooling pipe 34 at three locations that are remote from each other in the left-right direction, which is the length direction of the first wire harness 18a and the second wire harness 18b. The heat conductive sheet 42 has insulation properties and has a flat sheet shape. Anything can be adopted as the heat conductive sheet 42 as long as a heat conductivity is improved in the thickness direction. For example, it is possible to adopt a heat conductive body described in Japanese Unexamined Patent Publication No. JP-A-2015-105282, in which a heat conductive filler is contained in a base material made of an elastomer or the like, and the heat conductivity is improved in the thickness direction by the heat conductive filler being oriented. It is also possible to adopt the one described in Japanese Unexamined Patent Publication No. JP-A-2009-051148, in which a base material made of polyurethane foam (a foam) and a magnetic filler blended in the base material are included, the magnetic filler having a shape other than a sphere, and by the magnetic filler being connected by at least one of line contact and planar contact with each other and oriented, the heat conductivity is improved in the thickness direction. Since the base material is a foam, the heat conductive member easily deforms following the outer surface shapes of the first wire harness 18a, the second wire harness 18b, the tubular member 20, and the cooling pipe 34. Therefore, it is possible to advantageously increase the contact area of the heat conductive member with the first wire harness 18a, the second wire harness 18b, the tubular member 20, and the cooling pipe 34. Besides, the heat conductive sheet 42 has flexibility, and the thickness dimension can be changed according to the force applied in the vertical direction. In the present embodiment, the heat conductive sheets 42 each have a sheet shape, but the shape of the heat conductive member is not limited to the sheet shape, and any shape can be adopted.

Assembly Process of the Heat Dissipation Structure 10 for a Wire Harness

Next, an example of the assembly process of the heat dissipation structure 10 for a wire harness will be described. The process of assembling the heat dissipation structure 10 for a wire harness is not limited to the following description.

First, the cooling pipe 34, the first wire harness 18a, the second wire harness 18b, and three heat conductive sheets 42 are prepared. The three heat conductive sheets 42 are cut into a predetermined shape by a known method such as Thomson die cutting.

Next, the tubular member 20 is prepared. The tubular member 20 includes the tubular portion main body 26, the lid body 28, and the fixing leg portions 33, and is formed by pressing a metal plate material into a predetermined shape. The fixing leg portions 33 are attached to a predetermined position of the tubular portion main body 26 by any means such as welding. The lid body 28 covers the upper opening of the tubular portion main body 26 and is held in a locked state.

Then, one cooling pipe 34 is inserted from above the tubular portion main body 26 and arranged at the center portion in the width direction of the bottom wall 30 of the tubular portion main body 26 (see FIG. 4). Next, the heat conductive sheets 42, 42, and 42 are placed from above at three locations that are remote from each other in the length direction of the cooling pipe 34 (see FIG. 2). At this time, the intermediate portion in the length direction of each heat conductive sheet 42 is wound around and brought into close contact with the outer peripheral surface of the cooling pipe 34 from the upper side to constitute an outer peripheral close-contact portion 44 described later (see FIG. 4). Subsequently, the first wire harness 18*a* and the second wire harness 18*b* are inserted into the inside of the tubular portion main body 26 so as to be placed on the opposite end portions in the length direction of each heat conductive sheet 42 from above. By so doing, the opposite end portions in the length direction of each heat conductive sheet 42 are wound around and brought into close contact with the respective outer peripheral surfaces of the first wire harness 18*a* and the second wire harness 18*b* from the lower side to constitute a first side close-contact portion 46 and a second side close-contact portion 48 described later. Finally, the upper opening of the tubular portion main body 26 is covered with the lid body 28 in a locked state to complete the heat dissipation structure 10 for a wire harness.

In the present embodiment, as shown in FIG. 4, the heat dissipation body is constituted by the cooling pipe 34 and the tubular member 20 extending in a rectangular cross-sectional shape. The cooling pipe 34 is arranged at the center portion in the width direction (the Y direction in FIG. 4) of the bottom wall 30 of the tubular portion main body 26 of the tubular member 20, and the first wire harness 18*a* and the second wire harness 18*b* are arranged at the parts that are remote from the cooling pipe 34 to the opposite sides in the width direction. The intermediate portion in the length direction (the Y direction in FIG. 4) of the heat conductive sheet 42 constitutes the outer peripheral close-contact portion 44 that is wound around and brought into close contact with the outer peripheral surface of the cooling pipe 34 from the upper side of the cooling pipe 34. The opposite end portions in the length direction of the heat conductive sheet 42 constitute the first side close-contact portion 46 and the second side close-contact portion 48 that are wound around and brought into close contact with the respective outer peripheral surfaces of the first wire harness 18*a* and the second wire harness 18*b* from the lower side of the first wire harness 18*a* and the second wire harness 18*b*.

Additionally, the first wire harness 18*a* and the second wire harness 18*b* are in contact with the cooling pipe 34 at respective first contact parts 50 with the outer peripheral close-contact portion 44 sandwiched in between in the thickness direction. Besides, the first wire harness 18*a* and the second wire harness 18*b* are in contact with the bottom wall 30 of the tubular portion main body 26 of the tubular member 20 at respective second contact parts 52, which are different from the first contact parts 50, with the first side close-contact portion 46 and the second side close-contact portion 48 sandwiched in between in the thickness direction. Furthermore, the first wire harness 18*a* and the second wire harness 18*b* are in contact with the side wall 32 of the tubular portion main body 26 of the tubular member 20 at respective third contact parts 56, which are different from the first and second contact parts 50, 52, with the first side close-contact portion 46 and the second side close-contact portion 48 sandwiched in between in the thickness direction. Explaining with reference to FIG. 4, in the first wire harness 18*a*, the second contact part 52 is located at a position shifted by 45 degrees counterclockwise from the first contact part 50 in the circumferential direction, and the third contact part 56 is located at a position further shifted by 90 degrees counterclockwise from the second contact part 52 in the circumferential direction. Similarly, in the second wire harness 18*b*, the second contact part 52 is located at a position shifted by 45 degrees clockwise from the first contact part 50 in the circumferential direction, and the third contact part 56 is located at a position further shifted by 90 degrees clockwise from the second contact part 52 in the circumferential direction.

As described above, the heat dissipation structure 10 for a wire harness includes the first wire harness 18*a* and the second wire harness 18*b*, the cooling pipe 34 and the tubular member 20 constituting the heat dissipation body, and the heat conductive sheet 42 constituting the heat conductive member. The first wire harness 18*a* and the second wire harness 18*b* are in contact with the cooling pipe 34 constituting the heat dissipation body in a heat conductive manner at the first contact part 50 via the heat conductive sheet 42, for example. Moreover, the first wire harness 18*a*, the second wire harness 18*b*, and the cooling pipe 34 constituting the heat dissipation body sandwich the heat conductive sheet 42 in the thickness direction, which is a specific direction in which the heat conductivity is improved, and are pressed against each other.

Subsequently, working effects of the present embodiment will be described. According to the present embodiment, with a simple structure in which the first wire harness 18*a*, the second wire harness 18*b* and the cooling pipe 34 are pressed against each other with the heat conductive sheet 42 sandwiched in between in the thickness direction, while the first wire harness 18*a*, the second wire harness 18*b* and the tubular member 20 are pressed against each other with the heat conductive sheet 42 sandwiched in between in the thickness direction, it is possible to efficiently construct a heat transfer path of the first wire harness 18*a* and the second wire harness 18*b* to the cooling pipe 34 and the tubular member 20 with a small number of parts.

Besides, the first wire harness 18*a*, the second wire harness 18*b*, and the cooling pipe 34, the tubular member 20 constituting the heat dissipation body are pressed against each other with the heat conductive sheet 42 sandwiched in between in the thickness direction in which the heat conductivity is improved. Therefore, heat conduction from the first wire harness 18*a* and the second wire harness 18*b* to the cooling pipe 34 and the tubular member 20 via the heat conductive sheet 42 is advantageously promoted. Moreover, it is acceptable as long as the heat conductive sheet 42 is interposed between the first wire harness 18*a*, the second wire harness 18*b* and the cooling pipe 34, the tubular member 20 so as to be sandwiched in the thickness direction, which is the specific direction. Thus, the heat dissipation structure 10 for a wire harness of the present disclosure can be easily applied without changing the configurations of the existing first wire harness 18*a*, second wire harness 18*b*, cooling pipe 34, and tubular member 20, thereby stably maintaining efficient heat conduction. Therefore, it is possible to provide the heat dissipation structure 10 for a wire harness that is able to surely obtain excellent heat dissipation while improving versatility with a simple structure.

By adopting the flexible heat conductive sheet 42 as the heat conductive member, it is possible to dispose the heat conductive sheet 42 along the surface of the first wire harness 18a, the second wire harness 18b, the cooling pipe 34, and the tubular member 20 having various shapes. This makes it possible to surely realize the configuration in which the heat conductive sheet 42 is sandwiched between the first wire harness 18a, the second wire harness 18b and the cooling pipe 34, the tubular member 20 in the thickness direction of the heat conductive sheet 42 in which the heat conductivity is improved. Therefore, the heat dissipation structure 10 for a wire harness, which is more versatile, can be easily provided while reliably obtaining the excellent heat dissipation. Further, by adopting the sheet-shaped heat conductive sheet 42 as the heat conductive member, for example, it is possible to advantageously avoid the possibility that the heat conductive member is unnecessarily arranged between the first wire harness 18a, the second wire harness 18b and the cooling pipe 34, the tubular member 20 in a direction other than the direction in which the heat conductivity is improved, which may cause heat to be trapped.

As in Embodiment 1, by interposing the heat conductive sheet 42 between the first wire harness 18a, the second wire harness 18b and the cooling pipe 34 in the thickness direction in which the heat conductivity is improved so as to press the first wire harness 18a, the second wire harness 18b and the cooling pipe 34 against each other, the heat generated in the first wire harness 18a and the second wire harness 18b can be quickly transferred to the cooling pipe 34 to efficiently realize heat dissipation (heat absorption) to the cooling pipe 34. Besides, the heat conductive sheet 42 is interposed between the first wire harness 18a, the second wire harness 18b and the tubular member 20 in the thickness direction in which the heat conductivity is improved, and the first wire harness 18a and the second wire harness 18b are pressed against the tubular member 20 against each other. This makes it possible to quickly transfer the heat generated in the first wire harness 18a and the second wire harness 18b to the tubular member 20 to efficiently realize heat dissipation to the atmosphere via the tubular member 20.

In addition, since the heat conductive sheet 42 is sandwiched between the first wire harness 18a, the second wire harness 18b and the cooling pipe 34, the tubular member 20 in the thickness direction in which the heat conductivity is improved, heat dissipation of the first wire harness 18a and the second wire harness 18b through heat transfer to the cooling pipe 34 and the tubular member 20 can be efficiently achieved. Therefore, even with such a simple structure as to dispose the heat conductive sheets 42 at three locations that are remote from each other in the length direction of the first wire harness 18a and the second wire harness 18b (the X direction in FIG. 2), the desired heat dissipation of the first wire harness 18a and the second wire harness 18b can be realized. This makes it possible to achieve cost reduction, weight reduction, and the like as compared with the case where the heat conductive member is provided over the entire length of the first wire harness 18a and the second wire harness 18b.

Other Embodiments

The technology described herein is not limited to the embodiment, which have been described using the foregoing descriptions and the drawings. For example, embodiments described below are also within the technical scope of the technology described herein.

In Embodiment 1 described above, an example including one cooling pipe 34 is shown, but the present disclosure is not limited to such an embodiment. As in Embodiment 2 of the present disclosure shown in FIGS. 5 and 6, a first cooling pipe 34a and a second cooling pipe 34b may be included. Specifically, inside the tubular member 20, the first cooling pipe 34a and the second cooling pipe 34b are respectively arranged on the upper side and the lower side at the center portion in the width direction of the bottom wall 30 of the tubular portion main body 26, and the first wire harness 18a and the second wire harness 18b are arranged at locations that are remote from the first cooling pipe 34a and the second cooling pipe 34b to the opposite sides in the width direction. A heat conductive sheet 58 is wound around the first wire harness 18a and the second wire harness 18b in an annular shape, and the annular heat conductive sheet 58 is provided with a pair of recessed portions 62, 62 recessed from the upper and lower sides in the gap between the remote first wire harness 18a and second wire harness 18b. The first cooling pipe 34a and the second cooling pipe 34b are respectively arranged in the pair of recessed portions 62, 62. The first cooling pipe 34a and the second cooling pipe 34b are respectively in contact with the lid body 28, which is the upper wall of the tubular member 20, and the bottom wall 30. The first wire harness 18a and the second wire harness 18b are in contact with the first cooling pipe 34a and the second cooling pipe 34b at respective upper first contact parts 64 and at respective lower first contact parts 66 with the heat conductive sheet 58 sandwiched in between in the thickness direction. The first wire harness 18a and the second wire harness 18b are in contact with the bottom wall 30, the side wall 32, and the lid body 28 of the tubular member 20 at respective second through fourth contact parts 52, 56, 57 provided at different parts in the respective circumferential directions with the heat conductive sheet 58 sandwiched in between in the thickness direction. The fourth contact part 57 is a part of the first wire harness 18a and the second wire harness 18b that is in contact with the lid body 28 via the heat conductive sheet 58. Explaining with reference to FIG. 6, in the first wire harness 18a, the fourth contact part 57 is located at a position shifted by 90 degrees counterclockwise from the third contact part 56 in the circumferential direction. Similarly, in the second wire harness 18b, the fourth contact part 57 is located at a position shifted 90 degrees clockwise from the third contact part 56 in the circumferential direction.

Figure 5:
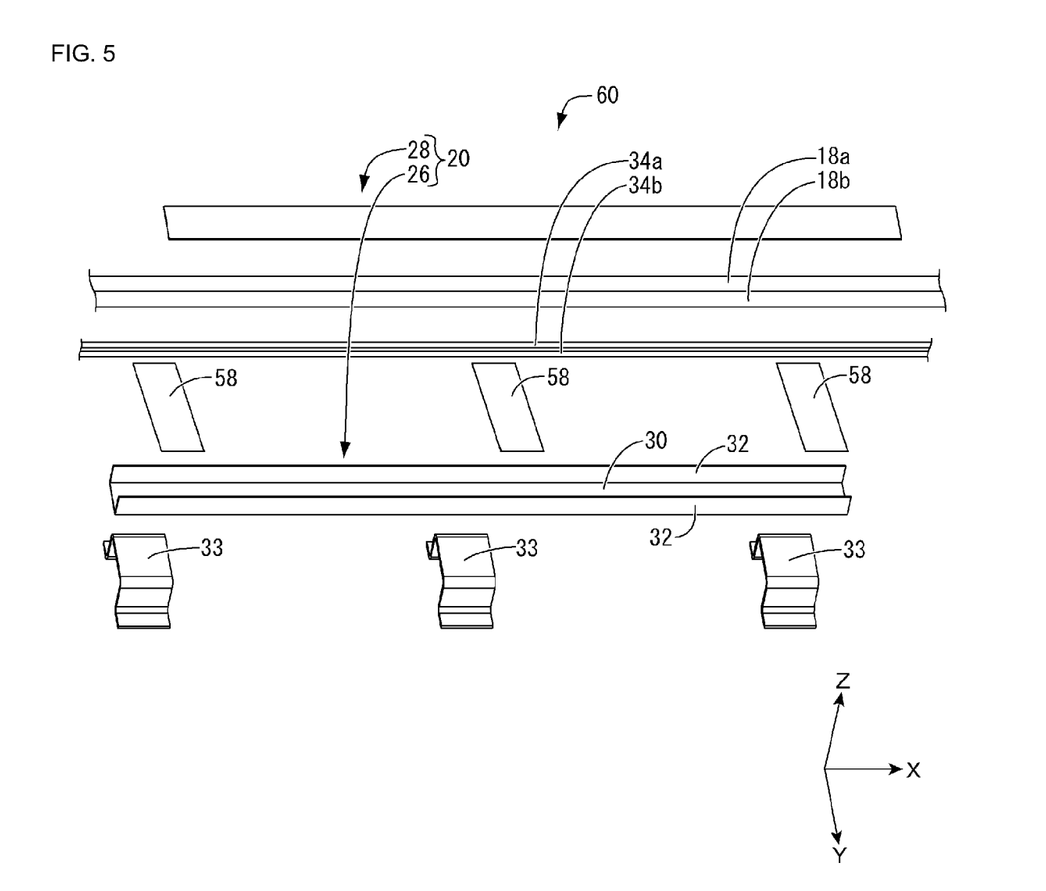
FIG. 5 is an exploded perspective view of a heat dissipation structure for a wire harness according to Embodiment 2.
Figure 6:
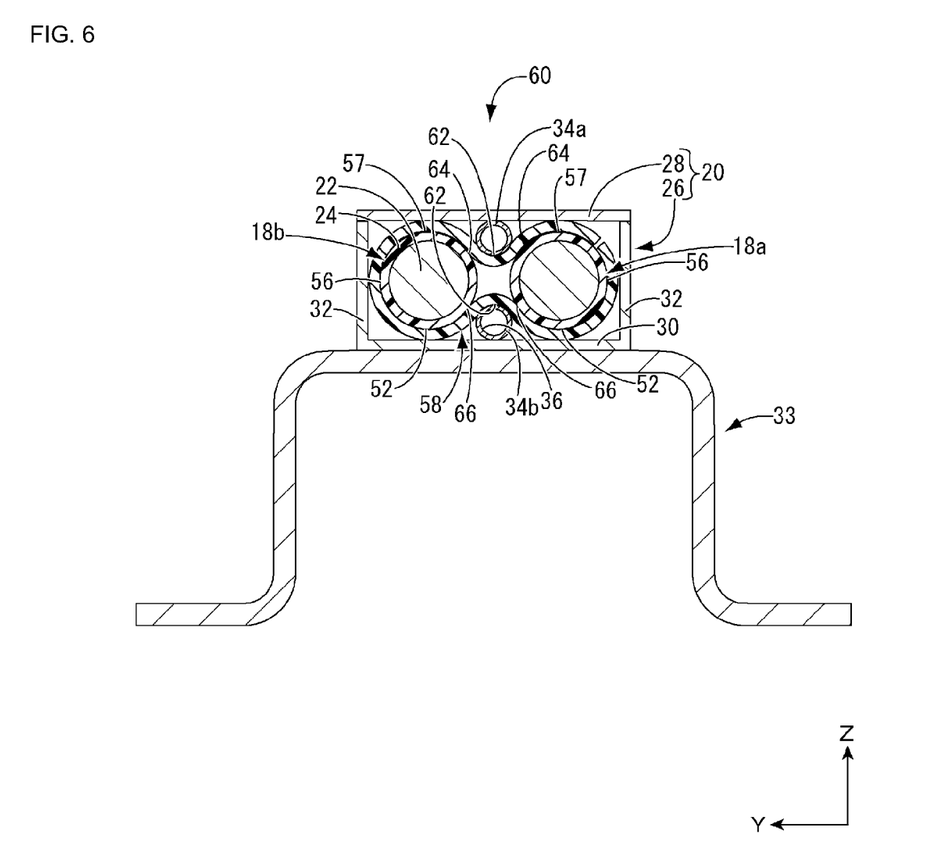
FIG. 6 is a cross-sectional view of the heat dissipation structure for a wire harness according to Embodiment 2, corresponding to FIG. 4.

This makes it possible to bring the heat conductive sheet 58 into close contact with the lower outer peripheral surfaces of the first wire harness 18a and the second wire harness 18b, the upper outer peripheral surface of the second cooling pipe 34b, the upper outer peripheral surfaces of the first wire harness 18a and the second wire harness 18b, and the lower outer peripheral surface of the first cooling pipe 34a. The first wire harness 18a, the second wire harness 18b, the first cooling pipe 34a, the second cooling pipe 34b, and the heat conductive sheet 58 constituted in this way are housed in the tubular portion main body 26. By covering the upper opening of the tubular portion main body 26 with the lid body 28 in a locked state, a heat dissipation structure 60 for a wire harness of Embodiment 2 is completed.

In this way, in Embodiment 2, inside the tubular member 20, it is possible to stably hold the first wire harness 18a, the second wire harness 18b, the first cooling pipe 34a, and the second cooling pipe 34b in predetermined parts via the heat conductive sheet 58. Besides, simply by winding the heat conductive sheet 58 in an annular shape around the first wire harness 18a and the second wire harness 18b that are remote from each other, the pair of recessed portions 62, 62 for housing the first cooling pipe 34a and the second cooling pipe 34b can be constituted. With this configuration, with the heat conductive sheet 58 sandwiched in the thickness direction, the first wire harness 18a, the second wire harness 18b and the tubular member 20 can be pressed against each other at a plurality of locations, while the first wire harness 18a, the second wire harness 18b and the first cooling pipe 34a and the second cooling pipe 34b can be pressed against each other at a plurality of locations. Therefore, an efficient heat transfer path of the first wire harness 18a and the second wire harness 18b to the tubular member 20, the first cooling pipe 34a, and the second cooling pipe 34b can be efficiently constructed with a small number of parts.

In Embodiment 1 described above, an example in which the tubular member 20 is included as the heat dissipation body is shown, but the present disclosure is not limited to such an embodiment. As in Embodiment 3 of the present disclosure shown in FIGS. 7 and 8, it is also acceptable to adopt a simple structure in which the first wire harness 18a, the second wire harness 18b, the cooling pipe 34, and a heat conductive sheet 70 are fixed by using a tie band 68 without using the tubular member 20. In this case, first, at three locations that are remote from each other in the length direction of the first wire harness 18a and the second wire harness 18b, the center portion of the heat conductive sheet 70 is wound around the cooling pipe 34, and the opposite end portions of the heat conductive sheet 70 projecting to the lateral side of the cooling pipe 34 (outward in the radial direction of the cooling pipe 34) are sandwiched between the first wire harness 18a and the second wire harness 18b from the width direction. Then, by binding and fixing the first wire harness 18a, the second wire harness 18b, the cooling pipe 34, and the heat conductive sheet 70 using the tie band 68, a heat dissipation structure 72 for a wire harness of Embodiment 3 is completed. For ease of understanding, the tie band 68 is illustrated by the imaginary line.

Figure 7:
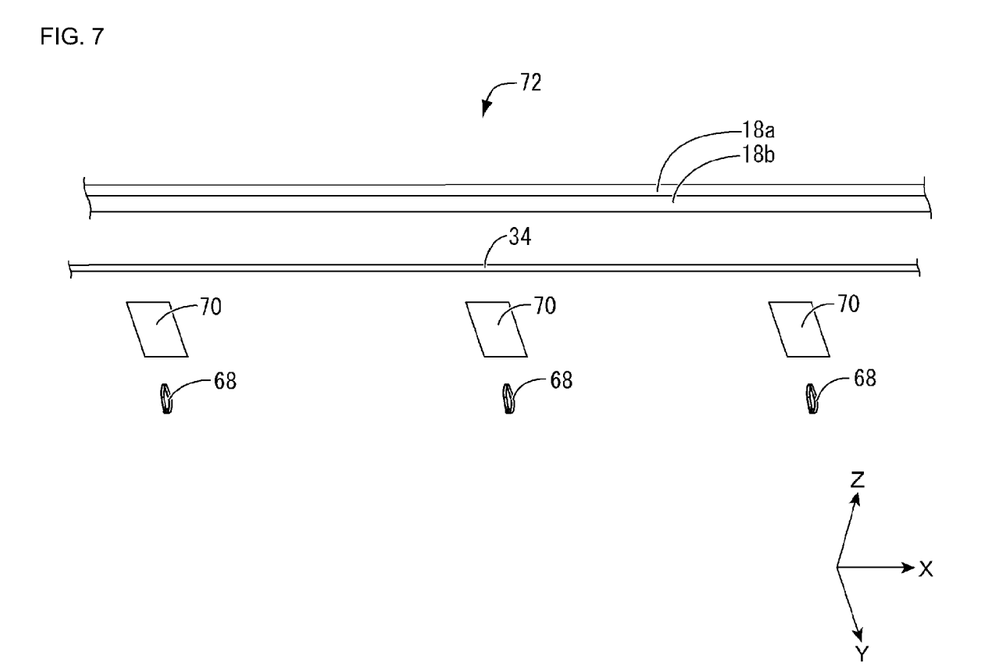
FIG. 7 is an exploded perspective view of a heat dissipation structure for a wire harness according to Embodiment 3.
Figure 8:
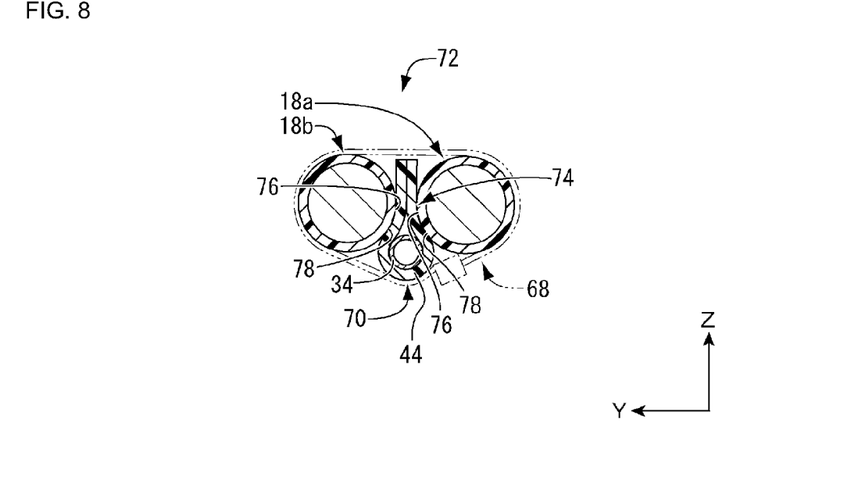
FIG. 8 is a cross-sectional view of the heat dissipation structure for a wire harness according to Embodiment 3, corresponding to FIG. 4.

The intermediate portion in the length direction of the heat conductive sheet 70 constitutes the outer peripheral close-contact portion 44 that is wound around and brought into close contact with the outer peripheral surface of the cooling pipe 34, while the opposite end portions in the length direction of the heat conductive sheet 70 are overlapped with each other to constitute a lateral projecting portion 74 projecting to the lateral side of the cooling pipe 34. The first wire harness 18a and the second wire harness 18b are pressed against each other at respective first contact parts 76 with the lateral projecting portion 74 sandwiched in between in the thickness direction, while being in contact with the cooling pipe 34 at respective second contact parts 78, which are different from the first contact parts 76, with the outer peripheral close-contact portion 44 sandwiched in between in the thickness direction. In this way, in Embodiment 3, by winding the heat conductive sheet 70 around the outer peripheral surface of the cooling pipe 34, the outer peripheral close-contact portion 44 and the lateral projecting portion 74 can be easily constituted. This makes it possible to advantageously construct a structure in which the first wire harness 18a, the second wire harness 18b, and the cooling pipe 34 are pressed against each other with the heat conductive sheet 70 sandwiched in between in the thickness direction. Moreover, the lateral projecting portion 74 in which the heat conductive sheet 70 is doubly overlapped is interposed between the contact surfaces of the first wire harness 18a and the second wire harness 18b. Therefore, in the first wire harness 18a and the second wire harness 18b, heat exchange with the cooling pipe 34, with which the first wire harness 18a and the second wire harness 18b are in contact with the single heat conductive sheet 70 sandwiched in between in the thickness direction, is preferentially promoted, so that the heat dissipation (heat absorption) of the first wire harness 18a and the second wire harness 18b by the cooling pipe 34 can be surely promoted.

Figure 9:
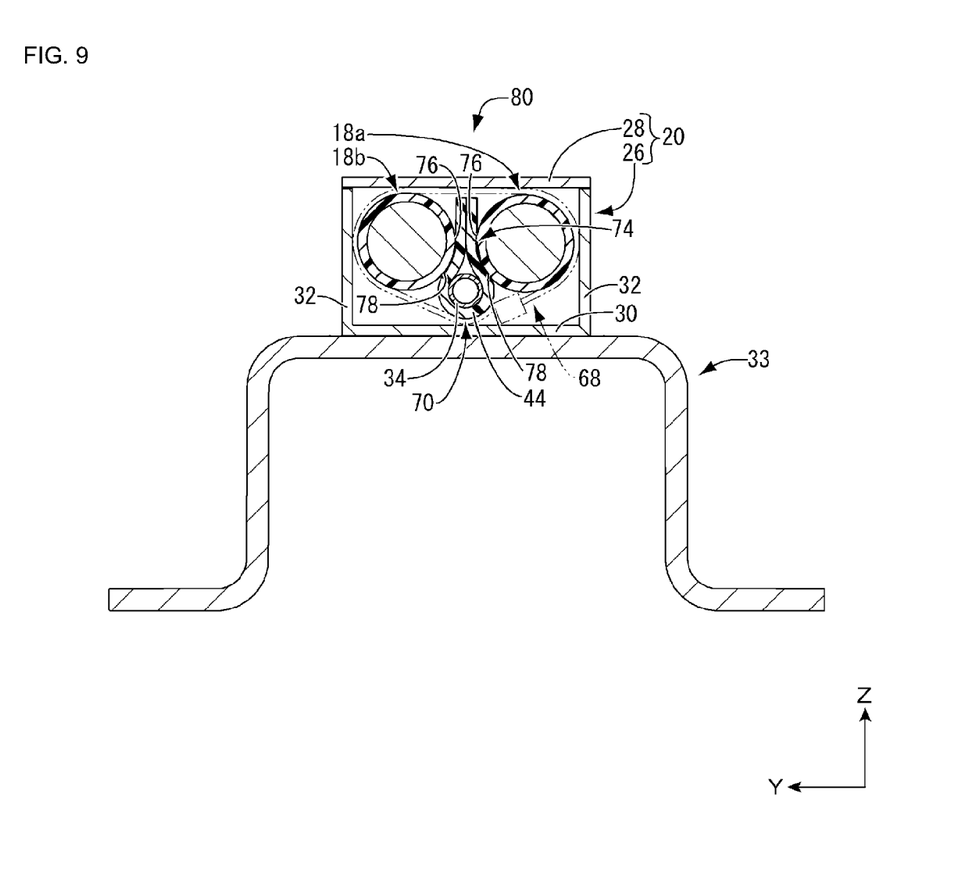
FIG. 9 is a cross-sectional view of a heat dissipation structure for a wire harness according to Variation of Embodiment 3, corresponding to FIG. 4.

The heat dissipation structure 72 for a wire harness of Embodiment 3 may be housed in the tubular member 20 like a heat dissipation structure 80 for a wire harness of Variation of Embodiment 3 of the present disclosure shown in FIG. 9. This makes it possible to stably hold the heat dissipation structure 80 for a wire harness in the tubular member 20.

In the illustrated embodiments, the heat conductive sheets 42, 58, 70 of sheet shape are adopted as the heat conductive member, but the present disclosure is not limited to such embodiments. Any shape can be adopted as the heat conductive member as long as the heat conductive member is interposed between the first wire harness 18a, the second wire harness 18b and the cooling pipe 34, the tubular member 20 in a specific direction in which the heat conductivity is improved.

In the illustrated embodiments, examples are shown in which the heat conductive members are provided at three locations that are remote from each other in the length direction of the first wire harness 18a and the second wire harness 18b. However, the heat conductive members may be provided at two locations, or at four or more locations. Moreover, the heat conductive member may be provided over the entire length of the first wire harness 18a and the second wire harness 18b in the length direction to further improve the heat conductivity.

In the illustrated embodiments, examples are shown in which the heat dissipation structures 10, 60, 72, 80 for a wire harness of the present disclosure are applied to the first wire harness 18a and the second wire harness 18b connecting the battery 16 and the inverter 12. However, the present disclosure is not limited to such embodiments, but the heat dissipation structures 10, 60, 72, 80 for a wire harness of the present disclosure are similarly applicable to the wire harness arranged at any part. Therefore, the number of wire harnesses, the structure of the heat dissipation body, and the like are not limited to the illustrated ones.

The invention claimed is:

1. A heat dissipation structure for a wire harness comprising:
   at least one wire harness;
   a heat dissipation body with which the wire harness is in contact in a heat conductive manner; and
   at least one heat conductive member whose heat conductivity is improved in a specific direction, wherein
   the wire harness and the heat dissipation body are pressed against each other with the heat conductive member sandwiched in between in the specific direction,
   the heat conductive member includes a heat conductive sheet having flexibility, and the specific direction is a thickness direction of the heat conductive sheet,
   the heat dissipation body is constituted by a cooling pipe extending along the wire harness and through which a refrigerant is inserted,
   an intermediate portion in a length direction of the heat conductive sheet constitutes an outer peripheral close-contact portion that is wound around and brought into close contact with an outer peripheral surface of the cooling pipe,
   opposite end portions in the length direction of the heat conductive sheet are overlapped with each other to constitute a lateral projecting portion projecting to a lateral side of the cooling pipe, the at least one wire harness comprises a first wire harness and a second wire harness, the first wire harness and the second wire harness are pressed against each other at respective first contact parts with the lateral projecting portion sandwiched in between in the thickness direction, and the first wire harness and the second wire harness are in contact with the cooling pipe at respective second contact parts, which are different from the first contact parts, with the outer peripheral close-contact portion sandwiched in between in the thickness direction.

2. The heat dissipation structure for a wire harness according to claim 1, wherein the heat conductive member includes a base material made of a foam.

3. The heat dissipation structure for a wire harness according to claim 1, wherein the at least one heat conductive member comprises a plurality of heat conductive members, and the heat conductive members are respectively arranged at a plurality of locations that are remote from each other in a length direction of the wire harness.

4. A heat dissipation structure for a wire harness comprising:

at least one wire harness;

a heat dissipation body with which the wire harness is in contact in a heat conductive manner; and at least one heat conductive member whose heat conductivity is improved in a specific direction, wherein the wire harness and the heat dissipation body are pressed against each other with the heat conductive member sandwiched in between in the specific direction;

the heat conductive member includes a heat conductive sheet having flexibility, and the specific direction is a thickness direction of the heat conductive sheet, the at least one wire harness comprises a first wire harness and a second wire harness, the heat dissipation body is constituted by a cooling pipe extending along the wire harness and through which a refrigerant is inserted, and a tubular member extending in a rectangular cross-sectional shape and in which the wire harness is housed in an inserted state, the cooling pipe is arranged at a center portion in a width direction of a bottom wall of the tubular member, and the first wire harness and the second wire harness are arranged at parts that are remote from the cooling pipe to opposite sides in the width direction, an intermediate portion in a length direction of the heat conductive sheet constitutes an outer peripheral close-contact portion that is wound around and brought into close contact with an outer peripheral surface of the cooling pipe from an upper side of the cooling pipe, opposite end portions in the length direction of the heat conductive sheet constitute a first side close-contact portion and a second side close-contact portion that are wound around and brought into close contact with respective outer peripheral surfaces of the first wire harness and the second wire harness from a lower side of the first wire harness and the second wire harness, the first wire harness and the second wire harness are in contact with the cooling pipe at respective first contact parts with the outer peripheral close-contact portion sandwiched in between in the thickness direction, and the first wire harness and the second wire harness are in contact with the tubular member at respective second contact parts, which are different from the first contact parts, with the first side close-contact portion and the second side close-contact portion sandwiched in between in the thickness direction.

5. A heat dissipation structure for a wire harness comprising:

at least one wire harness;

a heat dissipation body with which the wire harness is in contact in a heat conductive manner; and at least one heat conductive member whose heat conductivity is improved in a specific direction, wherein the wire harness and the heat dissipation body are pressed against each other with the heat conductive member sandwiched in between in the specific direction;

the heat conductive member includes a heat conductive sheet having flexibility, and the specific direction is a thickness direction of the heat conductive sheet, the at least one wire harness comprises a first wire harness and a second wire harness, the heat dissipation body is constituted by cooling pipes extending along the wire harness and through which a refrigerant is inserted, and a tubular member extending in a rectangular cross-sectional shape and in which the wire harness is housed in an inserted state, the cooling pipes comprising a first cooling pipe and a second cooling pipe, the first wire harness and the second wire harness are arranged at two locations that are remote from each other in a width direction of a bottom wall of the tubular member, the heat conductive sheet is wound around the first wire harness and the second wire harness in an annular shape, the heat conductive sheet wound in the annular shape is provided with a pair of recessed portions recessed from upper and lower sides in a gap between the first wire harness and the second wire harness, and the first cooling pipe and the second cooling pipe are arranged in the respective recessed portions, the first cooling pipe and the second cooling pipe are respectively in contact with an upper wall and the bottom wall of the tubular member, the first wire harness and the second wire harness are in contact with the cooling pipes at respective upper first contact parts and at respective lower first contact parts with the heat conductive sheet sandwiched in between in the thickness direction, and the first wire harness and the second wire harness are in contact with the bottom wall, a side wall, and the upper wall of the tubular member at respective second through fourth contact parts provided at different parts in respective circumferential directions with the heat conductive sheet sandwiched in between in the thickness direction.

* * * * *